United States Patent [19]
Compagne

[11] Patent Number: 5,315,149
[45] Date of Patent: May 24, 1994

[54] SELF-PROTECTED DIVIDING BRIDGE

[75] Inventor: Eric Compagne, La Tronche, France

[73] Assignee: Dolphin Integration S.A., Meylan, France

[21] Appl. No.: 35,765

[22] Filed: Mar. 24, 1993

[30] Foreign Application Priority Data

Mar. 25, 1992 [FR] France .................. 92 03972

[51] Int. Cl.$^5$ ........................... H01L 27/02
[52] U.S. Cl. .................... 257/536; 257/355
[58] Field of Search .................. 357/536, 355

[56] References Cited
U.S. PATENT DOCUMENTS 5,111,068  5/1992  Kusakabe ............ 257/536
5,134,456  7/1992  Kobatake ............ 257/536

Primary Examiner—Mark V. Prenty
Attorney, Agent, or Firm—Lowe, Price, LeBlanc & Becker

[57] ABSTRACT

A self-protected divider bridge in an integrated circuit comprising a P⁻ substrate, a N⁻ well, a P region forming a resistor, diffused in said well. A first and a second outmost contact and an intermediate contact are formed on the diffused region. A pad connected to the first contact receives an external voltage higher than the supply voltage of the integrated circuit. The reference potential of the integrated circuit is connected to the second contact and the substrate. A third contact formed on the well close to the first contact is connected to the first contact, and a fourth contact formed on the well close to the second contact is connected to the second contact.

5 Claims, 2 Drawing Sheets

SELF-PROTECTED DIVIDING BRIDGE

BACKGROUND OF THE INVENTION

The present invention relates to the field of over-voltage protection of integrated circuits and in particular to the protection of a dividing bridge comprised in an integrated circuit and receiving on one of its terminals a voltage higher than the supply voltage of this integrated circuit. Such a dividing bridge constitutes an input range extender for an integrated circuit.

To better understand the problem that the invention aims at solving, FIG. 1 shows an example of an integrated circuit associated with a step up regulator.

In FIG. 1, reference 1 designates an integrated circuit supplied between supply terminals VDD and VSS, for example respectively at +3 V and ground. A step up regulator 2 is also supplied by the voltages VDD and VSS. The step up circuit 2 conventionally comprises, for example, a coil 3 serially connected with a diode 4 and a capacitor 5. The junction of coil 3 and diode 4 is also connected to ground through a pulse controlled switch 6. Accordingly, in a known manner, a voltage $V_H$ is obtained across capacitor 5, which reaches a value higher than voltage VDD, for example 25 V.

For regulating voltage $V_H$ at a constant value, the switch 6 has to be suitably controlled. Accordingly, voltage $V_H$ is measured, its value is compared with a reference value and the comparison result determines the operation of switch 6. This regulation function is carried out by a portion of the integrated circuit 1.

In this integrated circuit, it is possible to have a reference voltage $V_O$ that is comprised between VSS and VDD, for example 1.2 volt. For comparing $V_H$ and $V_O$, the value $V_H$ has to be divided by a resistive bridge for obtaining a value $V_i$ which is normally equal to $V_O$. Values $V_O$ and $V_i$ are compared by a comparator 7 which controls one of the inputs of a NAND gate 8, the other input of which receives for example a square signal, and the output of which controls switch 6.

A problem lies in the implementation of the dividing bridge comprising resistors R1 and R2. If this dividing bridge is external to the integrated circuit, there is no specific problem. However, it is generally wished to integrate as many components as possible. Therefore, as shown, R1 and R2 are preferentially arranged inside the integrated circuit and voltage $V_H$ is connected to a pad of the integrated circuit. This pad must be protected against possible overvoltages originating from the voltage step up regulator, for example electrostatic discharges. This type of protection raises a specific problem because, usually, in an integrated circuit, the pad protection circuits clamp overvoltages having a value higher than the high supply potential VDD while, in the specific considered case, voltages $V_H$ which are substantially higher than VDD should not be clamped.

Protection circuits that can be associated with pads receiving high voltages have already been devised in the prior art and for example comprise MOS transistors with a thick gate insulator. However, the implementation of such unusual components is complex.

Moreover, in the field of integrated circuits, for example CMOS integrated circuits, resistors can be in the form of polycristalline stripes deposited on the upper surface of the substrate and insulated therefrom by oxide layers. However, when these resistors receive on one of their terminals a high voltage, they cannot be made on thin oxide layers which would break through under such voltages. Additionally, even with thick oxide layers, voltages applied on those resistors could create capacitive effects with underlying regions of the substrate and could limit the operating frequency of the system. Another drawback of such polysilicon resistors is that they have a low resistance per square and cannot be used for high value resistors. In any case, it is necessary with such resistors to associate with the connection pad an overvoltage protection circuit.

Another conventional way to make resistors in an integrated circuit consists in using doped stripes diffused in the substrate.

An example of such a resistor is schematically shown in the partial section view of FIG. 2A and in the corresponding upper view of FIG. 2B. The resistor is made between contacts A and B of a P-type stripe 10 diffused in a low doped N-type well 11, in turn formed in a low doped P-type substrate 12. An intermediate contact C on stripe 10 between contacts A and B constitutes an intermediate tap. Conventionally, well 10 is biased at the high supply potential VDD by a contact formed on a high doped region 13 arranged at the periphery of the well or at least close to the high potential contact on the stripe. The substrate 12 is biased at the low supply potential VSS. The contacts on the low doped regions are formed through areas of the same conductivity type with a higher doping level. In this conventional implementation, the resistor is insulated by the junction between regions 10 and 11 but this insulation is possible only if voltage $V_H$ remains lower than voltage VDD plus the forward voltage drop of a diode. As soon as $V_H$ gets higher than VDD, junction 10/11 is forward biased and there is no longer an insulation. This conventional implementation is thus not suitable for implementing resistors R1 and R2 in the circuit of FIG. 1.

Accordingly, for making resistors of the type of resistors R1 and R2, polysilicon resistors have conventionally been used with the above mentioned drawbacks.

SUMMARY OF THE INVENTION

An object of the invention is to form, in an integrated circuit, a dividing bridge that can have one of its terminals connected to a voltage higher than the supply voltage, that can comprise diffused resistors and that is self-protected against overvoltages on its terminals.

To attain these objects, the invention provides a self-protected divider bridge in an integrated circuit comprising a substrate of a first conductivity type with a low doping level, a well of the second conductivity type with a low doping level, a region of the first conductivity type, forming a resistor, diffused in said well, a first and a second outmost contact and an intermediate contact on said diffused region, a pad connected to said first contact and normally receiving an external voltage higher than the supply voltage of the integrated circuit, a reference potential of the integrated circuit connected to said second contact and to the substrate, a third contact formed on the well, close to the first contact, connected to said first contact, and a fourth contact formed on the well, close to said second contact, connected to said second contact.

According to an embodiment of the invention, the intermediate contact is connected to the supply voltage of the circuit through a protection device against overvoltages higher than the supply voltage.

According to an embodiment of the invention, said protection device is a diode, conductive if the voltage on the intermediate contact is higher than the supply voltage.

According to an embodiment of the invention, said diffused region has the shape of an elongated stripe.

BRIEF DESCRIPTION OF THE DRAWINGS

The foregoing and other objects, features and advantages of the invention will be described in more detail in the following description of preferred embodiments by referring to the attached drawings in which.

DESCRIPTION OF THE PREFERRED EMBODIMENTS

Figure 2A:
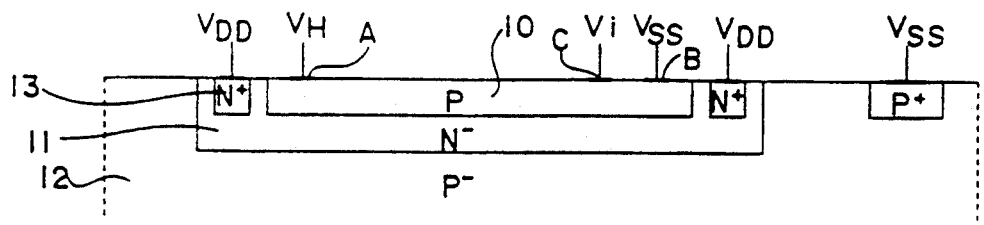
FIGS. 2A and 2B respectively show a partial section view and a corresponding front view of an integrated circuit illustrating a conventional diffused resistor and its biasing mode.
Figure 2B:
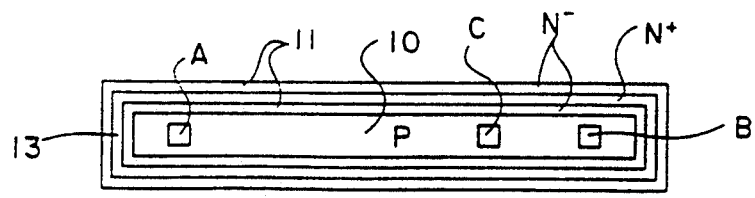
Figure 3A:
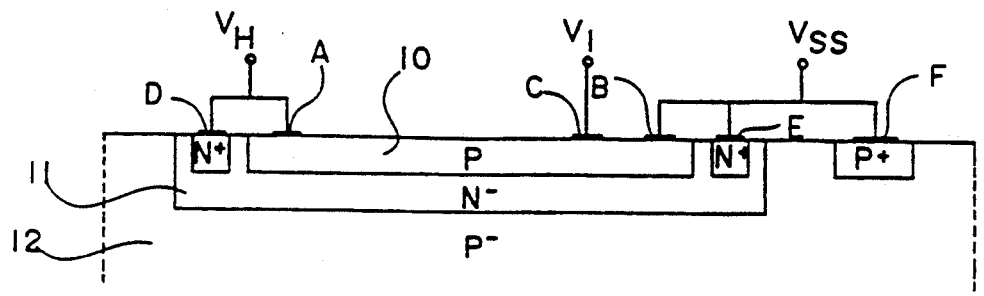
FIGS. 3A and 3B respectively show a section view and a front view of a diffused resistor according to the invention and its biasing mode.

FIG. 3A is a schematic section view of a self-protected dividing bridge according to the invention. This section view is similar to the section view of FIG. 2A but the component according to the invention differs from the one of FIG. 2 by its connection mode and in particular the biasing mode of well 11.

FIG. 3A shows the P-type diffused region 10, N$^-$-type well 11, and P$^-$-type substrate 12. The diffused region 10 has substantially the shape of a stripe and comprises outmost contacts A and B and an intermediate contact C. The diffused region 11 comprises outmost contacts D and E, respectively adjacent to the outmost contacts A and B of the diffused region 10. The substrate comprises a contact area F for biasing this substrate to the potential VSS.

According to the invention, contact D, close to contact A, is connected to contact A and contact E, close to contact B, is connected to contact B. Accordingly, there is a resistor R1 between contacts A and C, a resistor R2 between contacts C and B and a resistor R between contacts D and E, in parallel with the serial connection of resistors R1 and R2.

There is a basic operation difference between the structure according to the invention and the conventional structure of FIG. 2.

In the case of FIG. 2, the junction which insulates the resistor is the junction between regions 10 and 11, the N-type region 11 being normally biased higher than the P-type region 10 so that the PN junction is normally blocked except if voltage $V_H$ gets higher than VDD, in which case this junction is forward biased.

According to the invention, regions 10 and 11 are substantially at the same potential which decreases from value $V_H$ on the lefthand side of the figure to value VSS on the righthand side of the figure. The insulation of the resistor is due to the junction between well 11 and substrate 12, this junction being normally blocked because the N type region 11 is at a positive potential and P type region 12 is at the ground potential. The protection corresponds to the breakdown of this NP junction when the difference between voltages $V_H$ and VSS is higher than the avalanche voltage of this NP junction. N and P regions 11 and 12, such as obtained with usual CMOS manufacturing methods, have doping levels such that their avalanche voltage is about 50 to 100 V, for example 80 V. Accordingly, when voltage $V_H$ has a normal high value, junction 11/12 is blocked and, when voltage $V_H$ gets higher than the avalanche voltage of junction 11/12, for example due to an electrostatic discharge, this junction is forward biased and the excess energy is absorbed by the substrate towards ground. The resistor according to the invention is thus self-protected without it being necessary to add an additional protection device.

Figure 3B:
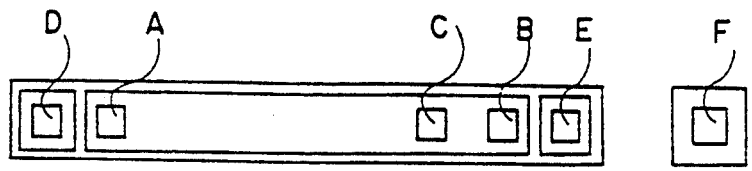

FIG. 3B shows an exemplary front view of the structure of FIG. 3. Contacts D and E on the well 11 (through an overdoped N$^+$-type region) are close to the respective contacts A and B with which they are connected. Of course, the resistor stripe between contacts A and B has a size selected for bearing the applied voltage and contact C is located to obtain a selected voltage between terminals C and B.

Figure 4:
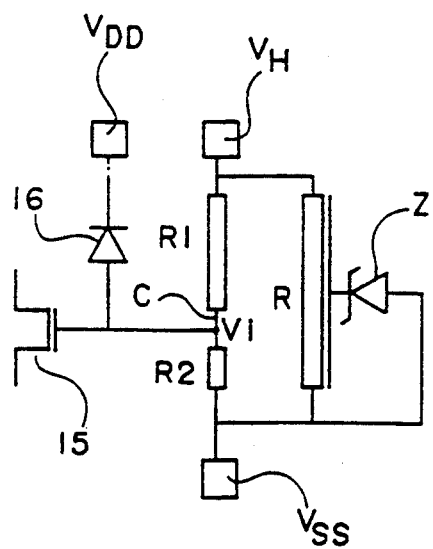
FIG. 4 is an equivalent diagram of the diffused dividing bridge according to the invention and its preferred connection mode.

FIG. 4 shows an equivalent diagram of the circuit according to the invention. Between pads connected to the potentials $V_H$ and VSS are resistors R1 and R2 and in parallel to the serial connection of those two resistors, is a resistor R corresponding to the resistance of layer 11 between contacts D and E. An avalanche diode Z formed by the NP junction 11/12 is distributed along resistor R, the cathode of this diode being connected to the side of the resistor and the anode of this diode being connected to pad VSS.

Figure 1:
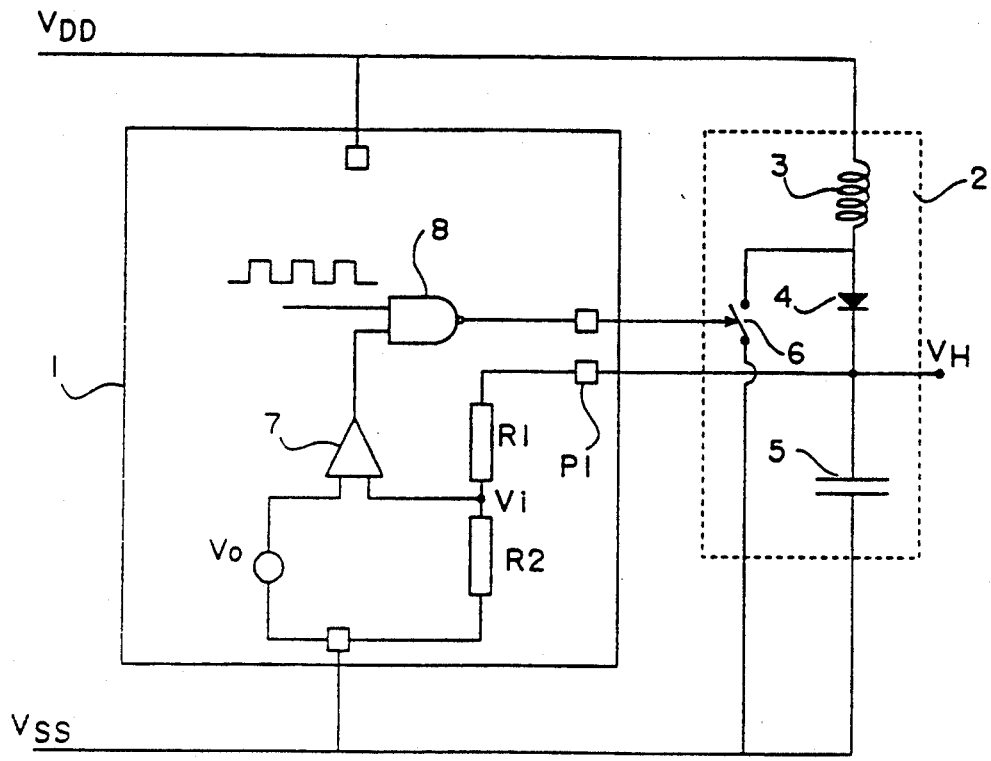
FIG. 1 shows a circuit illustrating the problem that the invention aims at solving.

It will be understood that, in usual applications, the contact C at potential $V_i$ is connected to the gate of a MOS transistor 15 constituting, for example, an input transistor of the comparator of FIG. 1. It is accordingly also necessary to prevent point C from attaining a voltage higher than a predetermined value, for example the supply voltage VDD of the integrated circuit. Any conventional protection device can be used for this purpose. For example, as shown in FIG. 4, terminal C is connected to the supply pad at voltage VDD through a diode 16, the anode of which is connected to contact C and the cathode to pad VDD. So, if the voltage on contact C exceeds voltage VDD (plus a forward voltage drop of a diode), the overvoltage is clamped. This device is useful because, as indicated above, the main protection only operates above a relatively high threshold (50 to 100 V) and point C could exceed voltage VDD before the main protection starts operating.

Those skilled in the art will note that the invention is liable of various implementations and applications. For example, in a differential two-wire transmission wherein each wire can have a peak voltage of 13 volts, a divider according to the invention can be used as an input range extender for an integrated circuit having a supply voltage in the range of 3 to 5 V. Additionally, all the conductivity types disclosed can be inverted provided that the polarities of the applied voltages are also inverted.

As an example, layer 10 can have a resistance per square of 50 to 100 ohms, substrate 12 a doping level of $5.10^{15}$ at./cm$^3$ and layer 11 a doping level of $5.10^{16}$ at./cm$^3$.

I claim:

1. A self-protected divider bridge in an integrated circuit comprising:
    a substrate of a first conductivity type with a low doping level,
    a well of a second conductivity type with a low doping level formed in the substrate, a region of the first conductivity type, forming a resistor, diffused in said well, a first and a second contact respectively formed on first and second opposite peripheral portions of said diffused region and an intermediate contact formed on said diffused region, a pad connected to said first contact and receiving an external voltage higher than a supply voltage of the integrated circuit, a reference potential of the integrated circuit connected to said second contact and to the substrate, a third contact formed on a third peripheral portion of the well adjacent said first peripheral portion and connected to said first contact and a fourth contact formed on a fourth peripheral portion of the well adjacent said second peripheral portion and connected to said second contact.

2. A divider bridge according to claim 1, wherein the intermediate contact is connected to the supply voltage of the circuit through a protection device against overvoltages higher than the supply voltage.

3. A divider bridge according to claim 2, wherein said protection device is a diode, conductive if the voltage on the intermediate contact is higher than the supply voltage.

4. A divider bridge according to claim 1, wherein said diffused region has the shape of an elongated stripe.

5. A divider bridge according to claim 1, wherein said first conductivity type is P-type and said second conductivity type is N-type.

* * * * *